United States Patent [19]

Narita et al.

[11] Patent Number: 4,858,095

[45] Date of Patent: Aug. 15, 1989

[54] MAGNETRON DRIVE APPARATUS

[75] Inventors: Ryuho Narita, Yokohama; Hidenori Kako, Yokosuka; Humihiro Imamura, Aichi, all of Japan

[73] Assignee: Kabushiki Kaisha Toshiba, Kawasaki, Japan

[21] Appl. No.: 259,707

[22] Filed: Oct. 19, 1988

[30] Foreign Application Priority Data

Dec. 4, 1987 [JP] Japan .................. 62-306927

[51] Int. Cl.$^4$ ................ H02M 3/335; H05B 9/06
[52] U.S. Cl. .................... 363/21; 363/75; 323/331; 323/334; 219/10.55 B
[58] Field of Search .................... 363/18–21, 363/75, 90, 95; 323/250, 251, 331, 332, 334; 219/10.55 B; 336/180, 184, 170

[56] References Cited

U.S. PATENT DOCUMENTS

| | | | |
|---|---|---|---|
| 3,780,252 | 12/1973 | Crapuchettes | 219/10.55 B |
| 3,818,314 | 6/1974 | Bishop et al. | 363/75 |
| 4,007,413 | 2/1977 | Fisher et al. | 363/18 |
| 4,041,267 | 8/1977 | Wechsler | 219/10.55 B |
| 4,236,055 | 11/1980 | Kaminaka | 219/10.55 B |
| 4,556,773 | 12/1985 | Yoshiyuki et al. | 219/10.55 B |
| 4,593,167 | 6/1986 | Nilssen | 219/10.55 B |

FOREIGN PATENT DOCUMENTS 56-28358  7/1981  Japan .

OTHER PUBLICATIONS

Nikkei Electronics 1987, (no. 426) pp. 106–107.
Conference of Kansai area branches of the society of electric and related technology 1987 "Development of a microwave oven using an inverter power source" S13.

*Primary Examiner*—Peter S. Wong
*Attorney, Agent, or Firm*—Foley & Lardner, Schwartz, Jeffery, Schwaab, Mack, Blumenthal & Evans

[57] ABSTRACT

In a magnetron drive apparatus a high frequency voltage converted and outputted by a frequency converter is inputted to a primary winding of a transformer and a high voltage power outputted from a secondary winding of the transformer is rectified and supplied to an anode of the magnetron and a power outputted from a heater winding of the transformer is supplied to a heater of the magnetron. The magnetron drive apparatus comprises a magnetic flux leakage device disposed in a magnetic path formed by the primary and secondary windings of the transformer and increasing a leakage magnetic flux in the magnetic path; and a device for winding the secondary winding and the heater winding therearound in a position opposite the primary winding with the magnetic flux leakage device arranged therebetween.

11 Claims, 9 Drawing Sheets

MAGNETRON DRIVE APPARATUS

The present invention relates to a magnetron drive apparatus, and in particular, to an improvement of a transformer for supplying an electric power to a magnetron.

BACKGROUND OF THE INVENTION

Conventionally, a magnetron is normally used in a portion for oscillating microwaves in a microwave oven. As is well known, in the magnetron, a direct current high voltage (3800 to 4000 V) is applied to an anode as is well known, and a constant voltage (about 4 V) as a heater voltage is applied to a filament for emitting electrons to the anode.

When a commercial power source voltage is increased to generate the direct current high voltage by a transformer in which silicon steel plates, etc. are stacked with each other to form a core and is rectified by a rectifier, the outer shape and weight of the transformer are greatly increased as the capacity of the transformer increases since the frequency is low.

Therefore, a dust core such as ferrite core having less electric loss by a high frequency electric current is used without using silicon steel in the transformer for driving the magnetron at the present time. A direct current voltage provided by rectifying a commercial electric source is converted to a high frequency power by an inverter device and is then inputted to a primary winding of the transformer and thereafter is increased to a several thousand voltage. Then, the increased voltage is rectified by a rectifier and is applied to an anode of the magnetron.

FIG. 1 shows a circuit diagram of a conventional apparatus for driving a magnetron using a direct current high voltage circuit. In this figure, a smoothing circuit 4A is composed of a choke coil 3 and a smoothing capacitor 4 and is connected in series between an anode and a cathode of a rectifing stack 2 for rectifing a commercial power source 1. One terminal of a primary winding 5a of a step-up transformer 5 is connected to a connection point between the smoothing capacitor 4 and the choke coil 3, and the other terminal of the primary winding 5a is connected to a cathode line through a resonant capacitor 6. Both terminals of the resonant capacitor 6 are connected in parallel to a free-wheeling diode 7 and collector and emitter of a transistor 8, and the base of the transistor 8 is connected to a control circuit 9 for controlling the switching operation of the transistor. The primary winding 5a, the resonant capacitor 6, the free-wheeling diode 7 and the transistor 8 form a quasi-E class inverter.

A voltage doubler rectifing circuit 11A is connected in parallel to a secondary winding 5b of the step-up transformer 5 and is composed of a diode 10 and a capacitor 11 connected in series to each other and controlling the charge and discharge of the secondary winding. A rectified output from both terminals of the diode 10 is applied between an anode A and a filament F of a magnetron 12. An alternating voltage as a heater voltage is supplied by a heater transformer 13 from the side of the commercial power source 1 to the filament F.

The operation of the conventional magnetron drive apparatus constructed above will be described next. First, when an alternating voltage is applied to the rectifing stack 2, all the alternating voltage waveforms are rectified and thereafter are smoothed by the smoothing circuit 4A composed of the choke coil 3 and the smoothing capacitor 4, and are then inputted to the direct current resonant circuit of the inverter composed of the primary winding 5a of the step-up transformer 5 and the resonant capacitor 6. With respect to the rectified input, when the transistor 8 is turned on by the control circuit 9, a primary electric current in the forward direction flows through the primary winding 5a and the transistor 8, and when the transistor 8 is turned off, the primary winding 5a and the resonant capacity 6 cause a series resonant state so that the voltage of the primary winding 5a is changed, generating a high frequency magnetic field by the repetition of this state. The high frequency power by the change of this magnetic field is increased to about 2000 V in accordance with the winding ratio of the step-up transformer 5, and thereafter becomes a rectified output at about 3800 to 4000 V by the voltage doubler rectifing circuit 11A composed of the diode 10 and the capacitor 11, and is then applied to the anode A of the magnetron 12. A voltage is supplied to the heater of the filament F of the magnetron 12 by another transformer 13 for the heater different from the step-up transformer 5, oscillating a microwave from the magnetron 12 by emitting electrons from the filament F.

However, in the conventional apparatus mentioned above, the transformer 13 for the heater is used separately from the step-up transformer 5, and is used for commercial frequency, thereby relatively increasing the weight thereof. Accordingly, a compact and light apparatus cannot be sufficiently provided in spite of using a dust core such as ferrite core for the step-up transformer 5 and forming the high voltage direct current power source circuit like an inverter. Further, the design of space for the apparatus is restricted and it is necessary to dispose two transformers, increasing the cost of the entire apparatus.

To solve the problems mentioned above, another conventional apparatus has been proposed as shown in FIG. 2. In this apparatus, a heater of a magnetron 12 is heated by a high frequency power outputted from a secondary winding 51c of a step-up transformer 51. The constitutional example of the step-up transformer 51 in this case is illustrated in FIG. 3. In the step-up transformer 51, a primary winding 51a and a secondary winding 51b are concentrically wound through a core 51e, and the secondary winding 51b on the high voltage side can be easily insulated by a bobbin 51f of the primary winding 51a, which is advantageous.

However, in the case of the step-up transformer 51, the coupling coefficient between the primary and secondary windings is increased so that the input inductance of the step-up transformer 51 is reduced and the oscillating frequency of the inverter becomes too high, providing no desirable output. To solve these problems, a coil 51d is connected in series to a capacitor 9' constituting a voltage doubler rectifing circuit to compensate the above inductance. However, as a result, it is necessary to dispose a separate coil although the transformer is a single unit so that the problems similar to those in the conventional apparatus provided with two transformers remain left.

The above description relates to the secondary winding for supplying power to the filament F, but it is necessary to reduce the variation in power supplied to the filament F as small as possible so as to stably operate the magnetron as characteristics of the magnetron. When the power supplied to the filament F is low, the amount of electrons emitted from the filament F, i.e., the emitted electrons therefrom become insufficient, resulting in molding in which the magnetron is unstably oscillated. When the supplied power is excessive, an excessive electric current flows through the filament F, damaging the filament and the magnetron and greatly reducing the life thereof. In general, it is necessary to be able to operate a microwave oven even when the input power source voltage of the magnetron drive apparatus is fluctuated by ±10% of a rated voltage due to great variation in power demand. The variation in power supplied to the filament F depending on the variation of the input power source voltage must be restricted to output from the magnetron a stable microwave power with respect to the variation of the input power source voltage. Further, with respect to the characteristics of the magnetron, when the magnetron is operated continuously, the oscillating voltage of the magnetron is reduced by the increase in temperature of the magnetron itself. Thus, it is necessary to secure small variation in power supplied to the filament even when the load is varied.

As mentioned above, in the conventional drive apparatus of the magnetron constructed as above, it is necessary to dispose another transformation for supplying power to the filament of the magnetron in addition to the step-up transformer for supplying power to the anode of the magnetron, and it is necessary to connect a coil for compensating the input inductance onto the secondary winding side of the transformer even when the step-up transformer and the transformer for supplying the heater voltage are integral with each other, thereby increasing the cost of the entire apparatus. Further, the advantages that the magnetron drive apparatus is made compact and light are lost by using the inverter power source apparatus. Further, it is necessary to dispose a means for restricting the variation in power supplied to the filament with respect to the fluctuation of about ±10% of the power source voltage.

SUMMARY OF THE INVENTION

To overcome the problems mentioned above, an object of the present invention is to provide a magnetron drive apparatus having a step-up transformer in which a voltage increasing winding for supplying power to an anode of a magnetron and a winding for supplying heater power are wound around a same core, and the variation in heater power with respect to the variation in an input power source voltage can be restricted.

With the above object in view, the present invention resides in a magnetron drive apparatus in which a high frequency voltage converted and outputted by a frequency converter is inputted to a primary winding of a transformer and a high voltage power outputted from a secondary winding of the transformer is rectified and supplied to an anode of the magnetron and a power outputted from a heater winding of the transformer is supplied to a heater of the magnetron. The magnetron drive apparatus comprises magnetic flux leakage means disposed in a magnetic path formed by the primary and secondary windings of the transformer and increasing a leakage magnetic flux in the magnetic path; and means for winding the secondary winding and the heater winding therearound in a position opposite the primary winding with the magnetic flux leakage means arranged therebetween.

In the magnetron drive apparatus of the present invention, the coupling coefficient of the primary and secondary windings is lowered by the magnetic flux leakage means disposed therebetween and formed in the magnetic path.

Accordingly, the heater winding wound on the same side as the secondary winding is not almost affected by the variation in input power source voltage of the primary winding so that stable power can be supplied to the heater of the magnetron and stable microwave power can be obtained from the magnetron.

BRIEF DESCRIPTION OF THE DRAWINGS

The present invention will be more apparent from the following description of the preferred embodiments thereof in conjunction with the accompanying drawings in which.

DETAILED DESCRIPTION OF THE PREFERRED EMBODIMENTS

The preferred embodiments of the present invention will now be described with reference to the accompanying drawings.

Figure 1:
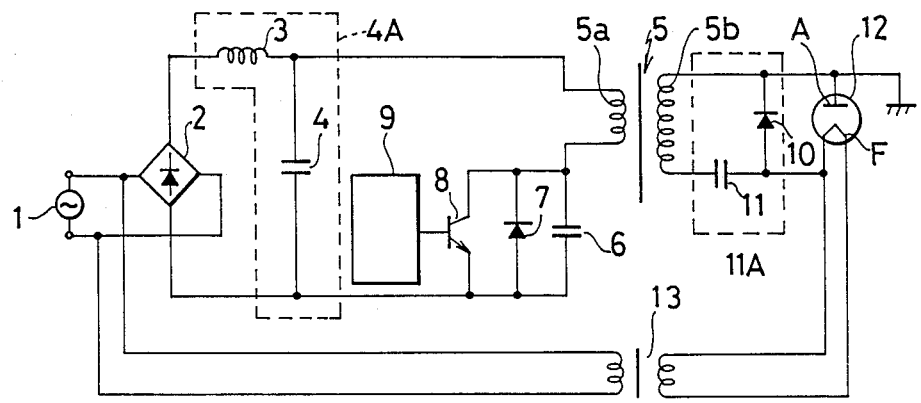
FIG. 1 is an entire circuit diagram of a conventional magnetron drive apparatus.
Figure 2:
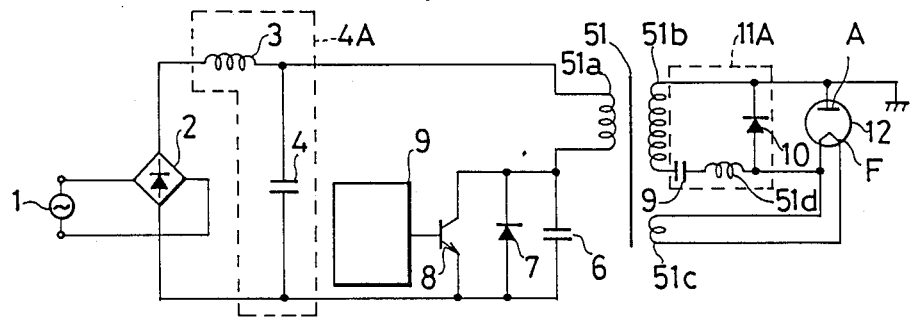
FIG. 2 is an entire circuit diagram of another conventional apparatus.
Figure 4:
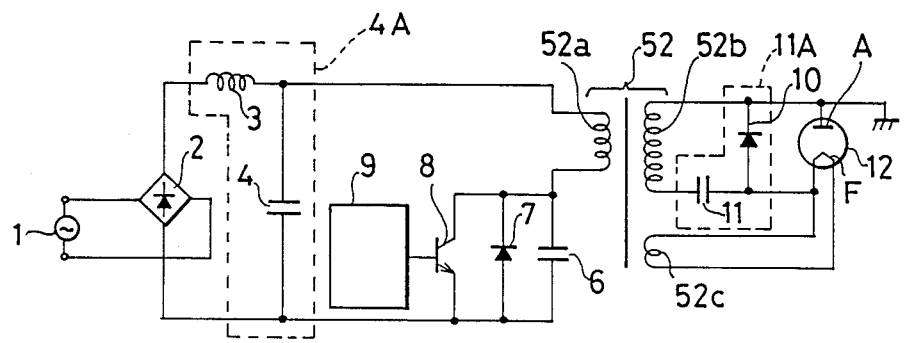
FIG. 4 is an entire circuit diagram of a magnetron drive apparatus in accordance with one embodiment of the present invention.
Figure 5:
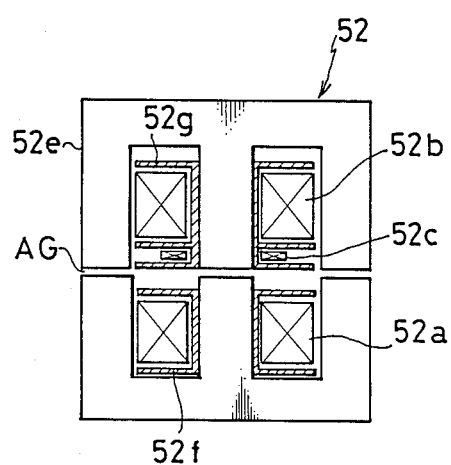
FIG. 5 is a cross-sectional view of a step-up transformer used in the embodiment of the present invention.

FIG. 4 shows an entire circuit diagram of a magnetron drive apparatus in accordance with one embodiment of the present invention. In this figure, the same or corresponding portions to those in FIG. 1 are designated by the same reference numerals, and the detailed description thereof is therefore omitted. In the embodiment of the present invention, a step-up transformer 52 is constituted in detail as shown by FIG. 5 illustrating a cross-sectional view thereof.

The step-up transformer 52 is constituted by opposing a pair of E-shaped cores 52e and disposing therebetween a clearance of gap AG having a predetermined distance. This gap AG is held at the predetermined distance by a spacer, for example.

A primary winding 52a is independently wound on the lower side of the core 52e, and a heater winding 52c and a secondary winding 52b are wound opposite the primary winding 52a with gap AG therebetween. The secondary winding 52b and the heater winding 52c are adjacent to each other and the coupling coefficient therebetween is large and are weakly coupled to the primary winding 52a.

Figure 9:
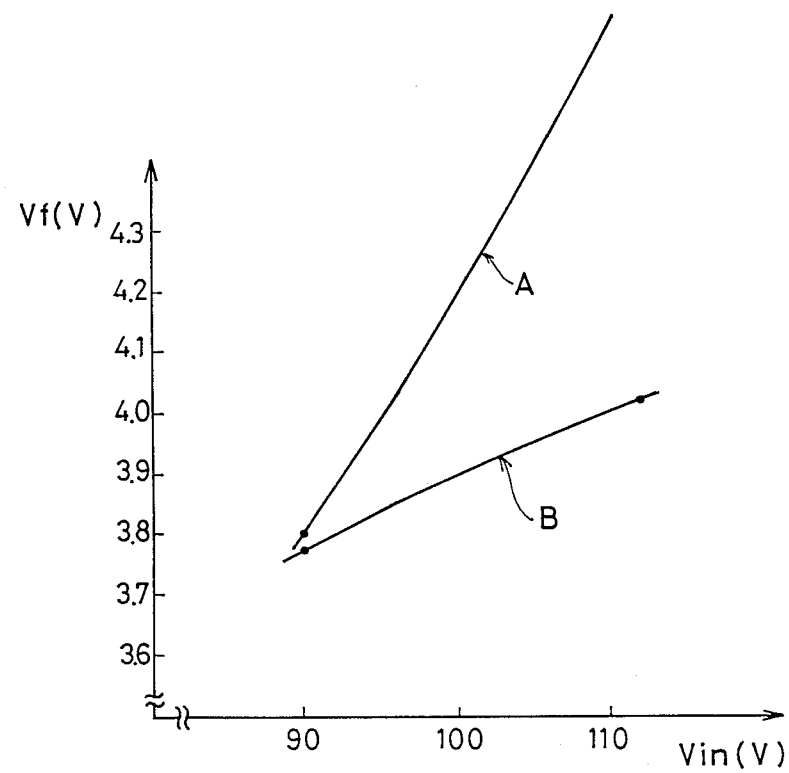
FIG. 9 is a view showing the characteristics of an input voltage of the step-up transformer.

The change in filament voltage $V_f$ generated at both ends of the heater winding 52c with respect to the variation in input power source voltage $V_{in}$ can be restricted to be small by winding the respective windings 52a, 52b and 52c mentioned above. Such a situation is illustrated in FIG. 9 showing curve B with respect to input voltage characteristics. The difference in input voltage characteristics is great with respect to larger and smaller coupling coefficients of the heater winding 52c and the primary winding 52a shown by curves A and B where curve A shows the larger coupling coefficient. Accordingly, since filament F is almost a resistance load, the power supplied to filament F is determined by voltage $V_f$, and the variation in power supplied to filament F is small if voltage $V_f$ is stable.

Figure 6:
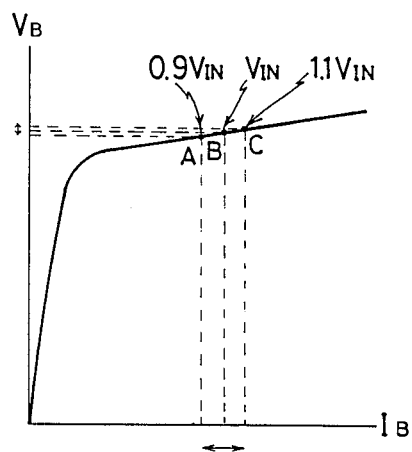
FIG. 6 is a view showing the operating characteristics of the magnetron.

The reasons for this are as follows in accordance with the characteristic curve of the magnetron shown in FIG. 6. $V_B$ and $I_B$ respectively designate a voltage between the anode and cathode, and an electric current flowing through the magnetron. FIG. 6 shows a curve like that provided by a Zener diode through which electric current $I_B$ rapidly flows at a value greater than a predetermined voltage value in the magnetron. As shown by the characteristic curve, when an input voltage is changed by ±10% with respect to a rated input voltage $V_{IN}$, voltage $V_{IN}$ is changed from point A to point C and current $I_B$ is greatly changed, but voltage $V_B$ is changed very slightly and is almost constant. Accordingly, the voltage caused by the secondary winding 52b is controlled by the voltage $V_B$ between the electrodes of the magnetron, and the generated voltage $V_B$ is almost contant even when the input voltage $V_{IN}$ is varied. Therefore, when a gap is disposed between the cores and the heater winding 52c is wound in the vicinity of the secondary winding 52b such that the primary and secondary windings 52a and 52b weakly coupled to each other and the heater winding 52c and the secondary winding 52b are closely coupled to each other so as to increase the coupling coefficient thereof, the variation in voltage induced by the heater winding is small and a heater power almost constant with respect to the input voltage variation can be supplied.

As shown in FIG. 9, when the commercial power source 100 V is varied by ±10% for example and filament voltage $V_f$ is 4 V, the filament voltage is varied by ±0.12 V, namely, ±3% by coupling the heater winding 52c to the secondary winding 52b, and is varied by ±0.4 V, namely, ±10% by coupling the heater winding 52c to the primary winding 52a. As can be seen from these results, the variation in filament voltage $V_f$ with respect to the variation in power source voltage can be greatly improved, thereby clearly stabilizing the oscillating operation of the magnetron.

Figure 7:
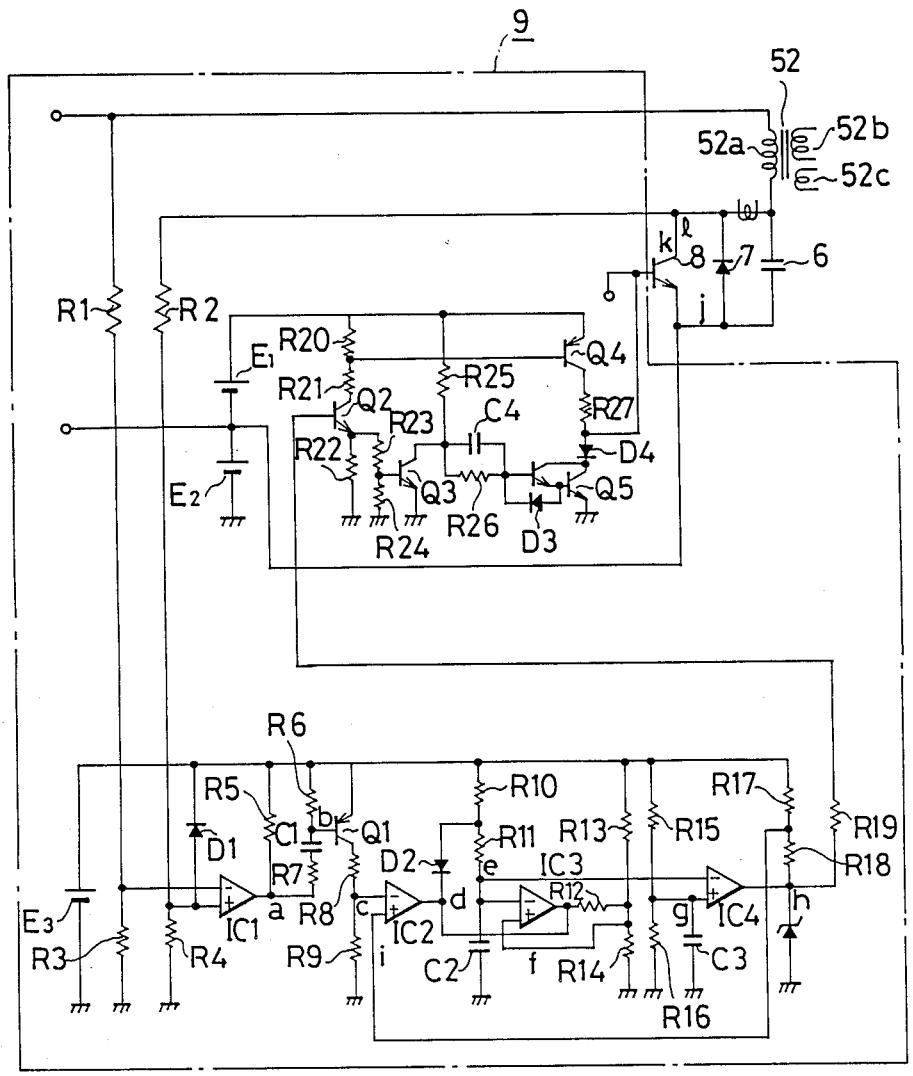
FIG. 7 is a circuit diagram of a control circuit used in the embodiment of the present invention.
Figure 8:
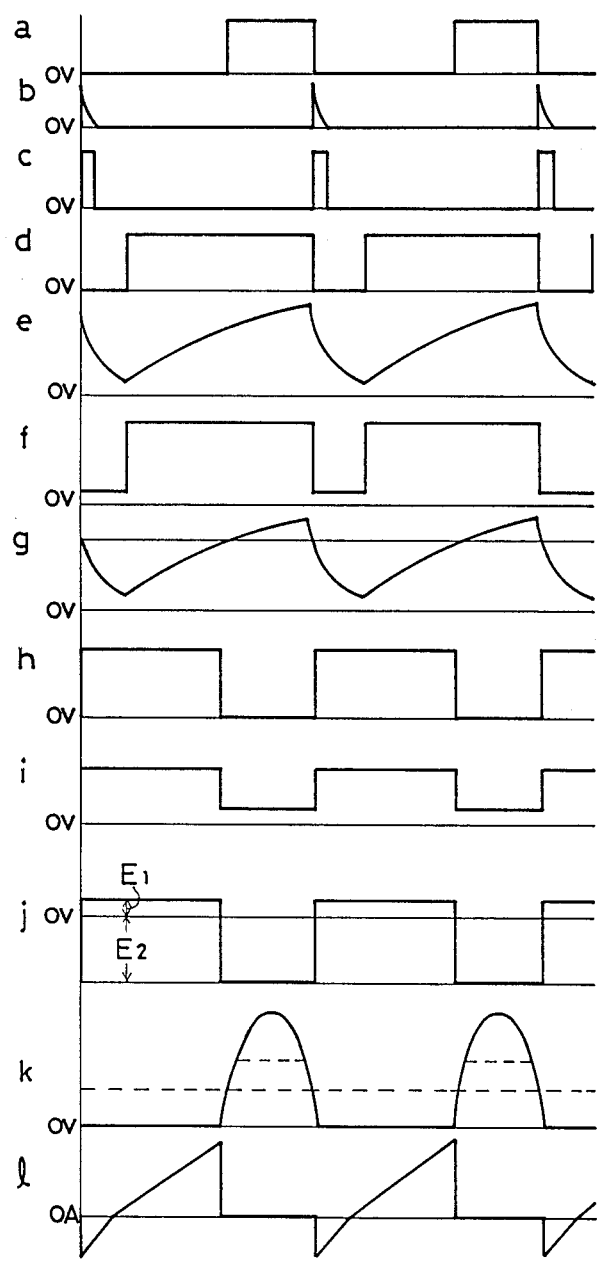
FIG. 8 is a view showing waveforms of respective base portions of the control circuit.

FIG. 7 illustrates the internal detailed construction of the control circuit 9 and FIG. 8 shows waveforms of signals of respective main portions thereof.

In FIG. 8, reference numeral a designates an output voltage of a comparator IC1, b a base current of a transistor Q1, c an input voltage on the minus side of a comparator IC2, d an output voltage on comparators IC2 and IC3, e an input voltage on the minus side of the comparators IC3 and IC4, f an input voltage on the plus side of the comparator IC3, g an input voltage on the plus and minus sides of the comparator IC4, h an output voltage of the comparator IC4, i an input voltage on the plus side of the comparator IC2, j potential $V_{BE}$ between the base and emitter of a transistor 8, k potential $V_{CE}$ between the collector and emitter of the transistor 8, and l designates synthetic current $I_c$ flowing to the collector of the transistor 8 and a parallel circuit of a diode 7.

Figure 10A:
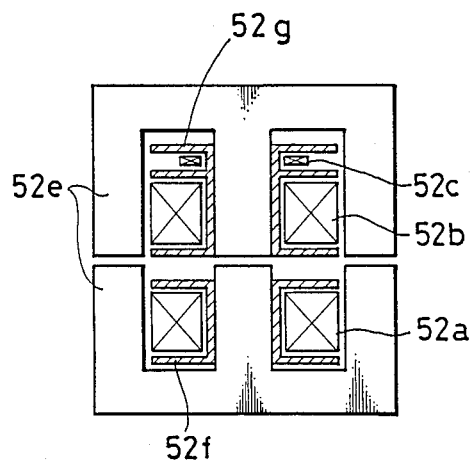
FIGS. 10A–10D, 11 and 13A–13C are cross-sectional views of the step-up transformer in another embodiment of the present invention.
Figure 10B:
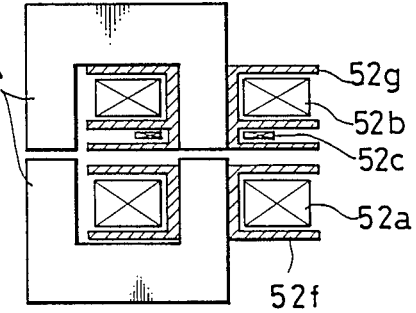
Figure 10C:
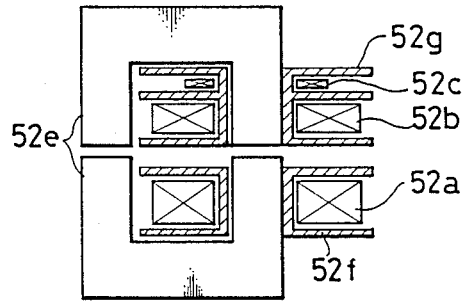

FIGS. 10A to 10D show another embodiment of the step-up transformer in accordance with the present invention. In FIG. 10A, a secondary winding 52b is disposed between a primary winding 52a and a heater winding 52c. In this case, in comparison with the step-up transformer shown in FIG. 5, the heater winding 52c and the primary winding 52a are further weakly coupled to each other, thereby increasing the stability of power for heating the filament with respect to the variation in input voltage. However, since the induced voltage generated in the heater winding 52c is reduced in comparison with the case shown in FIG. 5, it is necessary to increase the winding in accordance with this reduction. At this time, the power consumption due to heating of the winding in consideration of the skin effect due to high frequency current is increased more that in the case of FIG. 5. With respect to the shape of core, the cores shown in FIGS. 5 and 10A are constituted by E-shaped cores, but may be constructed by U-shaped cores as shown in FIGS. 10B and 10C.

Figure 10D:
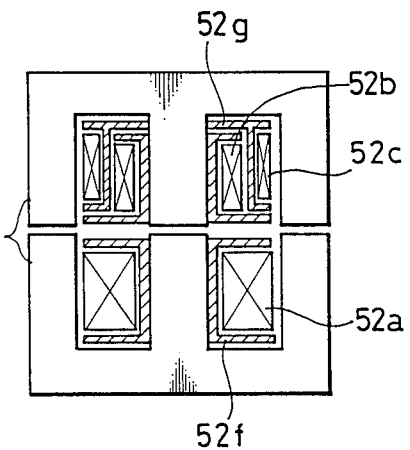

Further, in FIGS. 5 and 10A, an air layer is disposed between a primary winding bobbin 52f and a secondary winding bobbin 52g, but the coupling between the primary winding 52a and the heater winding 52c, or the coupling between the primary winding 52a and the secondary winding 52b may be closer than that in these figures without disposing any air layer. Therefore, a portion of the secondary winding bobbin 52g may be arranged on the side of the primary winding 52a from gap AG formed in the core. The important point is that the secondary winding 52b and the heater winding 52c are wound in proximity to each other so as to closely couple them to each other. Accordingly, the step-up transformer constructed as shown in FIG. 10D may be used.

Figure 11:
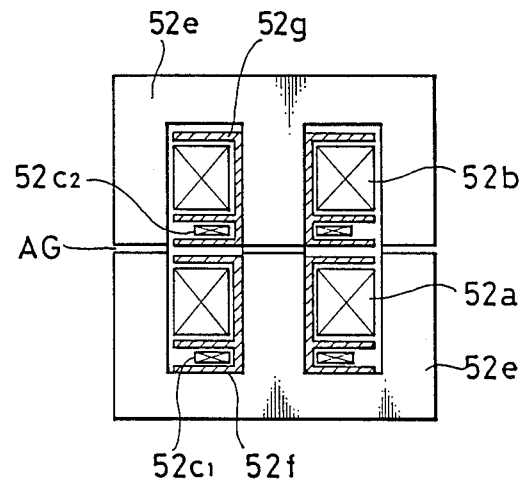

In the embodiments mentioned above, the primary winding 52a is wound around the core 52e in proximity to either one of the secondary winding 52b and the heater winding 52c. However, as shown in FIG. 11, a heater winding 52c may be divided into two heater windings $52c_1$ and $52c_2$, and one of them may be disposed in proximity to the primary winding 52a and the other may be disposed in proximity to the secondary winding 52b, and the divided heater windings $52c_1$ and $52c_2$ may be connected in series to each other, thereby constituting a step-up transformer for heating the filament of the magnetron. In the step-up transformer shown in FIG. 11, a magnetic path is formed by combining E-shaped cores 52e with each other, and the heater winding $52c_1$ and the primary winding 52a on the lower side are disposed opposite the heater winding $52c_2$ and the secondary winding 52b through gap AG. The divided heater winding $52c_1$ and $52c_2$ are coupled to the primary and secondary windings 52a and 52b in a suitable manner.

Figure 3:
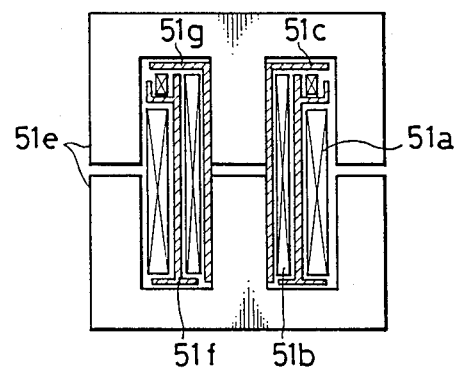
FIG. 3 is a cross-sectional view of a conventional step-up transformer.

Since gap AG is disposed between the primary winding 52a and the secondary winding 52b and deteriorates the coupling state therebetween, the input inductance is increased and it is possible to omit the coil 51d which is required in the circuit shown in FIG. 3. Further, as clearly shown by the operating characteristic curve of the magnetron in FIG. 6, the variation in input voltage can be restricted by winding the heater winding $52c_2$ so as to closely couple the heater winding $52c_2$ to the secondary winding $52b$.

Figure 12:
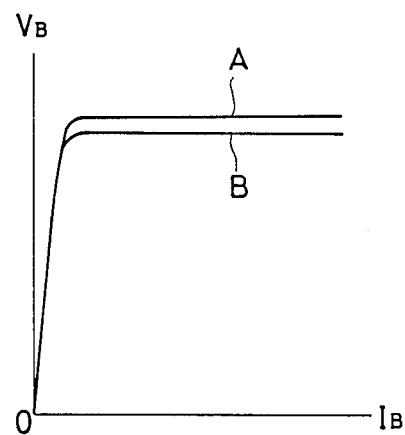
FIG. 12 is a view showing the operating characteristics of the magnetron when the temperature is increased.

In the continuous operation of the magnetron, the operating characteristics thereof are changed by the increase in temperature from curve A to curve B as shown in FIG. 12. However, even in such a case, since the change in input side primary winding $52a$ is not caused, the variation in power supplied to filament F can be reduced to be small when the heater winding $52c_1$ is closely wound around the input side primary winding $52a$. Accordingly, in the step-up transformer constructed in FIG. 11, the heater winding is divided into a plurality of windings and is closely wound together with the primary and secondary windings $52a$ and $52b$ so that the variation in power supplied to the filament can be restricted to be small even when the input power source voltage is varied and the operating characteristics of the magnetron are varied in the continuous operation thereof.

Figure 13A:
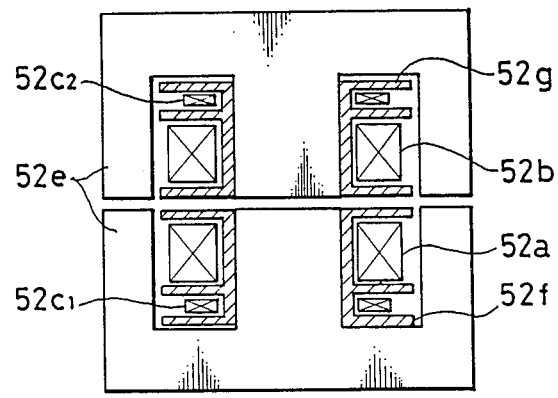

In FIG. 11, the air layer is disposed between the bobbin $52f$ for the primary winding and the bobbin $52g$ for the secondary winding. However, the coupling between the primary winding $52a$ and the secondary winding $52b$, the coupling between the primary winding $52a$ and the heater winding $52c$, or the coupling between the secondary winding $52b$ and the heater winding $52c$ may be closer than that in FIG. 11 without disposing the air layer. To provide such a structure, a portion of the bobbin $52g$ for the secondary winding may be arranged on the primary winding side from the core gap. The important point is that the heater winding is divided into respective heater windings $52c_1$ and $52c_2$ to closely couple these divided windings to the primary and secondary windings $52a$ and $52b$, and the divided windings are wound in proximity to the primary and secondary windings $52a$ and $52b$. Accordingly, the structures shown in FIGS. 13A and 13C may be used.

In the embodiments mentioned above, the material of core is constructed by ferrite, but may be constructed by any core material such as amorphous core having less heating loss at high frequency.

Figure 13B:
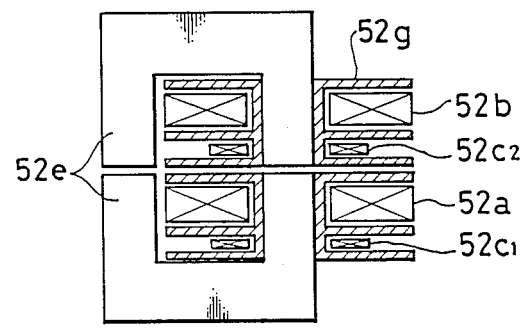
Figure 13:
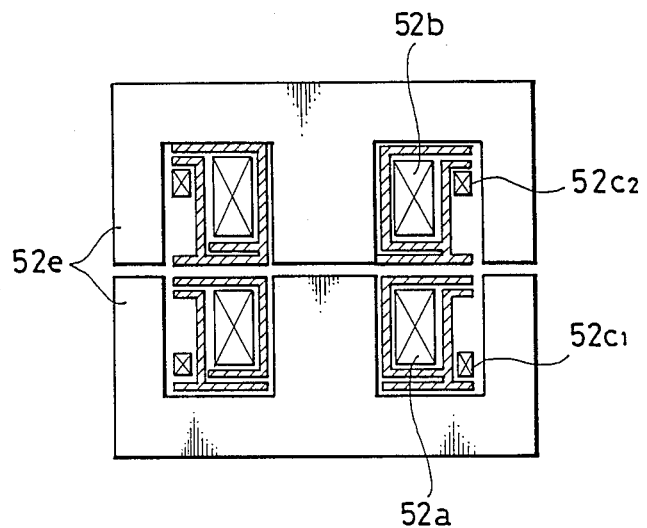

Further, the core is constructed by an E-shaped core in FIG. 11, but may be constructed by a U-shaped core shown in FIG. 13B illustrating the core by the same reference numeral. Further, similar to FIG. 13A, the divided heater winding $52c_2$ disposed in proximity to the secondary winding to improve the coupling state therebetween may be disposed on the opposite side of gap AG in proximity thereto. In the embodiments mentioned above, one bobbin for the primary winding $52a$ and the heater winding $52c_1$, and one bobbin for the secondary winding and the heater winding $52c_2$ are separately disposed, but such a bobbin structure may be constructed by a single bobbin for winding three windings therearound, separate four bobbins, or one bobbin for the secondary windings and one bobbin for the divided heater windings $52c_1$ and $52c_2$ and the primary winding.

As mentioned above, in accordance with the present invention, a magnetic flux leakage means is disposed to leak a magnetic flux between the primary and secondary windings of the transformer, and the heater winding for supplying power to the heater of the magnetron is disposed to be adjacent to the secondary winding so as to increase the coupling coefficient therebetween. Therefore, the heater voltage can discharge electrons in a stable state without being affected by the variation in input power source voltage on the primary winding side, thereby providing a stable microwave output from the magnetron. Further, since the heater winding is integral with the transformer, the apparatus for driving the magnetron is made compact and light and the cost thereof is reduced.

What is claimed is:

1. A magnetron drive apparatus in which a high frequency voltage converted and outputted by a frequency converter is inputted to a primary winding of a transformer and a high voltage power outputted from a secondary winding of the transformer is rectified and supplied to an anode of the magnetron and a power outputted from a heater winding of the transformer is supplied to a heater of the magnetron, said apparatus comprising:

magnetic flux leakage means disposed in a magnetic path formed by the primary and secondary windings of the transformer and increasing a leakage magnetic flux in the magnetic path; and means for winding the secondary winding and the heater winding therearound in a position opposite the primary winding with the magnetic flux leakage means arranged therebetween.

2. A magnetron drive apparatus as claimed in claim 1, wherein the magnetic flux leakage means comprises a clearance formed between a core for winding the primary winding therearound and a core for winding the secondary winding and the heater winding therearound.

3. A magnetron drive apparatus as claimed in claim 1, wherein the heater winding is divided and wound around cores disposed through a clearance and the respective windings are connected in series to each other.

4. A magnetron drive apparatus as claimed in claim 2, wherein the secondary winding and the heater winding are arranged to be adjacent to each other.

5. A magnetron drive apparatus as claimed in claim 4, wherein the heater winding is arranged between the primary and secondary windings.

6. A magnetron drive apparatus as claimed in claim 4, wherein the secondary winding is arranged between the primary winding and the heater winding.

7. A magnetron drive apparatus as claimed in claim 4, wherein the secondary winding and the heater winding are wound in proximity to each other so as to closely couple them to each other.

8. A magnetron drive apparatus as claimed in claim 4, wherein the primary winding is wound around the core in proximity to at least one of the secondary winding and heater winding.

9. A magnetron drive apparatus as claimed in claim 3, wherein the respective divided heater windings are constructed to closely couple them to the primary and secondary windings.

10. A magnetron drive apparatus as claimed in claim 2, wherein the cores are formed in the shape of an E.

11. a magnetron drive apparatus as claimed in claim 2, wherein the cores are formed in the shape of a U.

* * * * *